United States Patent

Hanchett

[15] 3,654,440

[45] Apr. 4, 1972

[54] COUNTER

[72] Inventor: George Draper Hanchett, Summit, N.J.

[73] Assignee: RCA Corporation

[22] Filed: July 7, 1970

[21] Appl. No.: 52,949

[52] U.S. Cl. ........................235/92 PE, 235/92 R, 235/92 T, 235/92 VA, 235/92 MB, 58/23

[51] Int. Cl. ........................H03k 21/16

[58] Field of Search ............235/92 T, 92 PE, 92 VA, 92 MC, 235/92 BD

[56] References Cited

UNITED STATES PATENTS 2,538,122 1/1951 Potter ..............235/92 BD 3,337,721 8/1967 Kuelz ..............235/92 MC 3,230,383 1/1966 MacArthur ..............235/92 T

*Primary Examiner*—Maynard R. Wilbur

*Assistant Examiner*—Robert F. Gnuse

*Attorney*—H. Christoffersen

[57] ABSTRACT

Multiple stage counter for counting to a value which is less than the total number of states the stages can assume. When the desired maximum count is reached, the counter switches directly back to its minimum count. During the switching between certain counts, for example from the maximum to the minimum count, a holding circuit responsive to the previous condition of one of the counter stages prevent another counter stage from assuming an undesired state.

8 Claims, 5 Drawing Figures

INVENTOR.
George D. Hanchett

INVENTOR.
George D. Hanchett

COUNTER

BACKGROUND OF THE INVENTION

Digital counters can be constructed by cascading circuits each of which has an integral number of stable states. Circuits having two stable states (bistable) are in common use and are broadly classed as flip-flops.

Bistable circuits are connected to count in binary, that is, to the base 2. The binary cyclical counter composed of $n$ stages in cascade can count to a maximum value of $2^n-1$ from which value the counter returns to zero, and begins again. Including the zero state of the counter, there are $2^n$ discrete states of the counter.

It is often desirable to have a maximum count value that cannot be expressed as $2^n-1$ where $n$ is an integer. A decimal counter, for instance, in which the maximum count value is 9, is expressed as $2^n-1$ where $n$ is approximately 3.32. Because it is necessary to have an integral number of stages, a minimum of four binary stages is required in a decimal counter. The maximum count value of a four-stage counter, however, is $2^4-1$, or 15. In order for a four-stage counter to be cyclical with a maximum count value of 9, feedback circuits are provided to bypass the states having values 10 to 15. Many such examples are well known in the art.

In some applications, specifically electronic digital clocks, a cyclical counter must be interrupted during part of the normal count and returned to some minimum count value not in sequence. For example, in 12-hour clocks, the unit hours counter begins at count 1, is incremented by 1 cyclically to 9, then begins to count from zero to a maximum of 2, at which time the count is interrupted and restarted at 1.

In other words, the unit hours counter of a clock proceeds cyclically on a decimal basis except that after every other count value of 2, the count is interrupted and re-started at 1. In a 24-hour clock, the hours from 1 PM to 11 PM are represented as 13 to 23, and the hour of 12 midnight is represented by zero or 24. The unit hours counter counts cyclically on a decimal basis except that on every third count value of 4, the count is interrupted and re-started at zero.

The problem of constructing such a counter has been dealt with in many ways. One method has been to construct a counter that has 12 or 24 cyclical states so that the count is always cyclical. One of the disadvantages of such a system is that the states of the counter must be decoded into decimal representation.

Another method of solving this problem has been to provide binary coded decimals (BCD) counter stages for each digit of the clock with feedback circuitry to change those stages of the clock which are incorrect after the interruption of the cycle. One of the disadvantages of this method is the complicated networks necessary to achieve the desired result.

The object of this invention is to provide another solution to the problem described above, which solution is relatively economical to implement and which requires relatively simple circuits.

BRIEF DESCRIPTION OF THE INVENTION

At the end of each counting cycle, the counting stages of the circuits of the present invention are directly switched from states representing the maximum count to states representing the minimum count, skipping the counts not of interest. During at least this transition, the signal generated by one of the stages may tend to switch another of the stages to an undesired counting state. Means are provided responsive to the condition of at least one of the stages prior to the time it is switched, for holding this other stage in its desired state until this signal is dissipated.

DETAILED DESCRIPTION

Figure 1:
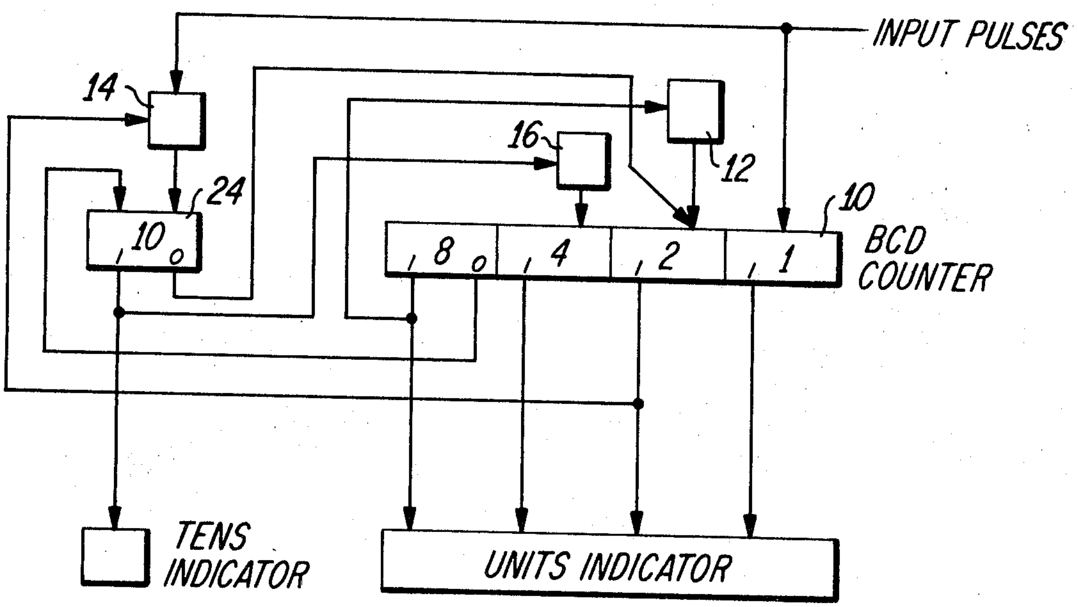
FIG. 1 is a simplified block diagram of the hours-counter of a 12-hour clock embodying the invention.

The principle of operation of a 12-hour clock counter according to the invention can be explained with reference to FIG. 1. The input pulses, which occur at the rate of one per hour, are coupled to stage 1 of a BCD counter 10 and a gating means 14.

The counter stages are coupled so that if zero represents a reset condition and 1 represents the set condition of each stage of the BCD counter 10, successive input pulses will cause the states of the counter 10 to count cyclically as shown in the following table.

| BCD Counter Table 8 | 4 | 2 | 1 | Decimal Count |
|---|---|---|---|---|
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 0 | 0 | 4 |
| 0 | 1 | 0 | 1 | 5 |
| 0 | 1 | 1 | 0 | 6 |
| 0 | 1 | 1 | 1 | 7 |
| 1 | 0 | 0 | 0 | 8 |
| 1 | 0 | 0 | 1 | 9 |
| 0 | 0 | 0 | 0 | 0 |

The interconnections within the BCD counter 10 required for the above cyclical count are shown later in the more detailed FIGS. 4 and 5.

When the 2's flip-flop is set, it primes gate means 14. During these periods, that is, at count values of 2, 3, 6 and 7, the input pulses applied to the gate means 14 cause the 10's flip-flop 24 to be reset. When the 2's flip-flop is reset, it maintains gate 14 disabled and the input pulses have no effect on the flip-flop 24.

After the BCD counter reaches the count of nine, i.e., 1001, the next input pulse causes the 8's flip-flop in the BCD counter 10 to be reset. Resetting the 8's flip-flop sets the 10's flip-flop 24 because the reset or 0 output of the 8's flip-flop is coupled to the set input of the 10's flip-flop 24. Therefore, after the 10th input pulse, the 10's flip-flop 24 is set and all stages of the BCD counter are reset. The next (11th) input pulse has no effect on the 10's flip-flop 24 (as gate means 14 is disabled) but sets the 1's flip-flop in the BCD counter 10. Thus, the counter indicates 11 (10001).

The next pulse, the 12th, resets the 1's flip-flop which is cross-coupled to the 2's flip-flop internally causing the latter to be set so that the counter has a count value of 12 (10010). The next input pulse enables the now primed gating means 14 and the latter resets the 10's flip-flop 24. Resetting the 10's flip-flop 24 causes the 2's flip-flop to be reset by means of a coupling between the reset (0) output of the 10's flip-flop and the reset input of the 2's flip-flop in the BCD counter 10.

Resetting the 2's flip-flop in the BCD counter would cause the 4's flip-flop to be set but a holding means 16 keeps the 4's flip-flop reset. The holding means 16 is activated by the 10's flip-flop 24 being set, but a built-in delay holds the 4's flip-flop reset for a short period of time after the 10's flip-flop 24 has been reset.

The same (the 12th) input pulse triggers the 1's flip-flop in the BCD counter 10 so that the BCD counter is now set to a count value of 1 and the 10's flip-flop 24 is reset. Therefore, the entire circuit is indicating a 1. This completes one cycle of the counter. The flip-flop count proceeds as shown in the following table. The decimal equivalent of the 12-hour counter state is shown.

12-HOUR COUNTER

| Dec. | 10 | 8 | 4 | 2 | 1 |
|---|---|---|---|---|---|
| 1 | 0 | 0 | 0 | 0 | 1 |
| 2 | 0 | 0 | 0 | 1 | 0 |
| 3 | 0 | 0 | 0 | 1 | 1 |
| 4 | 0 | 0 | 1 | 0 | 0 |
| 5 | 0 | 0 | 1 | 0 | 1 |
| 6 | 0 | 0 | 1 | 1 | 0 |
| 7 | 0 | 0 | 1 | 1 | 1 |
| 8 | 0 | 1 | 0 | 0 | 0 |
| 9 | 0 | 1 | 0 | 0 | 1 |
| 10 | 1 | 0 | 0 | 0 | 0 |
| 11 | 1 | 0 | 0 | 0 | 1 |
| 12 | 1 | 0 | 0 | 1 | 0 |
| 1 | 0 | 0 | 0 | 0 | 1 |

The output of the BCD counter is connected to a units indicator capable of displaying the decimal digits 0 through 9 and the 10's flip-flop is coupled to a tens indicator capable of displaying the digits 0 and 1. Included in the indicators may be decoding networks for converting the BCD count to the desired decimal digit.

A great advantage of this invention is that the count of 12 is maintained on a BCD basis so that standard decoder circuits can be used.

A second holding means 12 is shown in FIG. 1 for holding the 2's flip-flop in the BCD counter 10 reset while the 8's flip-flop is set and for a short period thereafter. This is part of the circuit which causes the counter to cycle as a BCD counter. It prevents the 2's flip-flop from being reset during the transition from the count of 9 to zero on the 10th pulse, that is, when the 1's flip-flop is reset.

Figure 2:
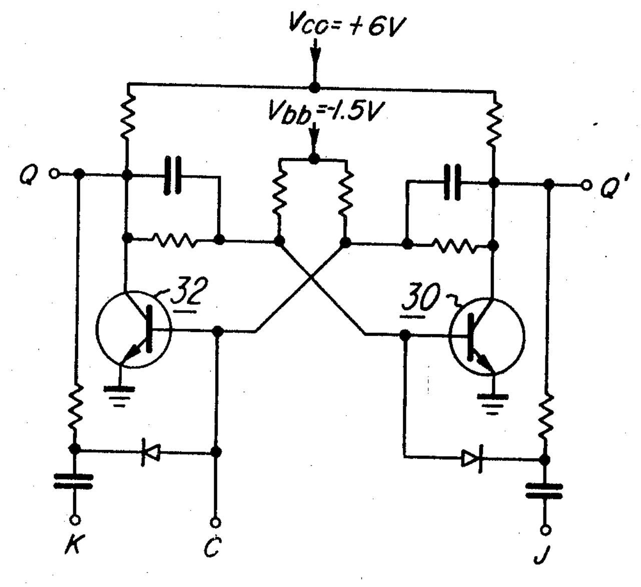
FIG. 2 is a schematic of a J-K flip-flop used in one embodiment of the invention.

The circuit used to implement the flip-flops in the block diagram of FIG. 1 is shown in FIG. 2 and is a well known type of flip-flop referred to as a J-K flip-flop. An input pulse on the J input, which here would be a negative-going pulse, cuts off the transistor 30 causing the voltage at Q′ to go positive (high). The transistor 30 is cross-coupled to the transistor 32 so that cutting off the transistor 30 drives the transistor 32 into conduction causing the voltage at Q to assume a value close to ground (a low). This is the set state of the flip-flop, that is, Q′ is high and Q is low, and is assumed in response to a negative pulse at J.

A negative pulse on the K input causes the transistor 32 to be cut off and the transistor 30 to conduct so that after a negative pulse on the K input, the output Q′ is low and the output Q is high. This is the reset state of the flip-flop.

Negative pulses on both the J and K inputs simultaneously will cause the flip-flop to change state, i.e., if Q is high it will go low, and if Q′ is high it will go low, and vice versa.

A terminal C which is direct-coupled to the base of transistor 32 is also available in the circuit. When a low signal is applied to this terminal, it clears, that is, it resets the flip-flop causing Q′ to go low and Q to go high.

Figure 3:
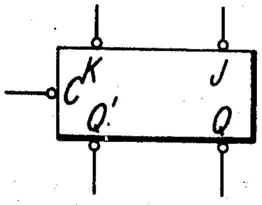
FIG. 3 is a block logic symbol used to represent the circuit of FIG. 2.
Figure 4:
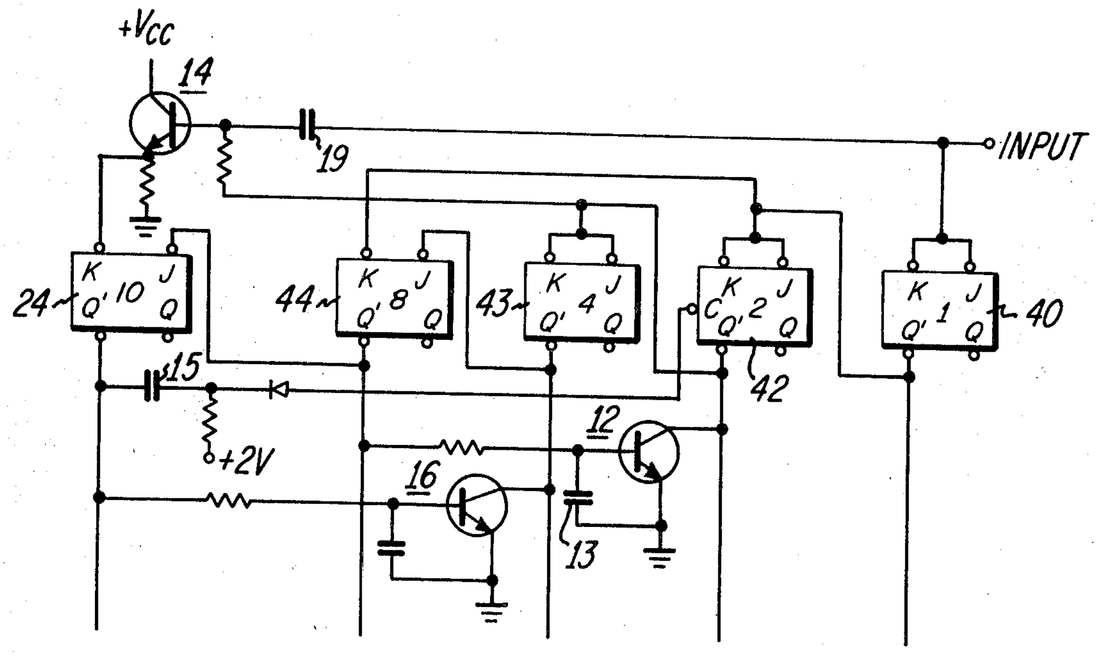
FIG. 4 is a logic diagram of the hours-counter of a 12-hour clock embodying the invention.
Figure 5:
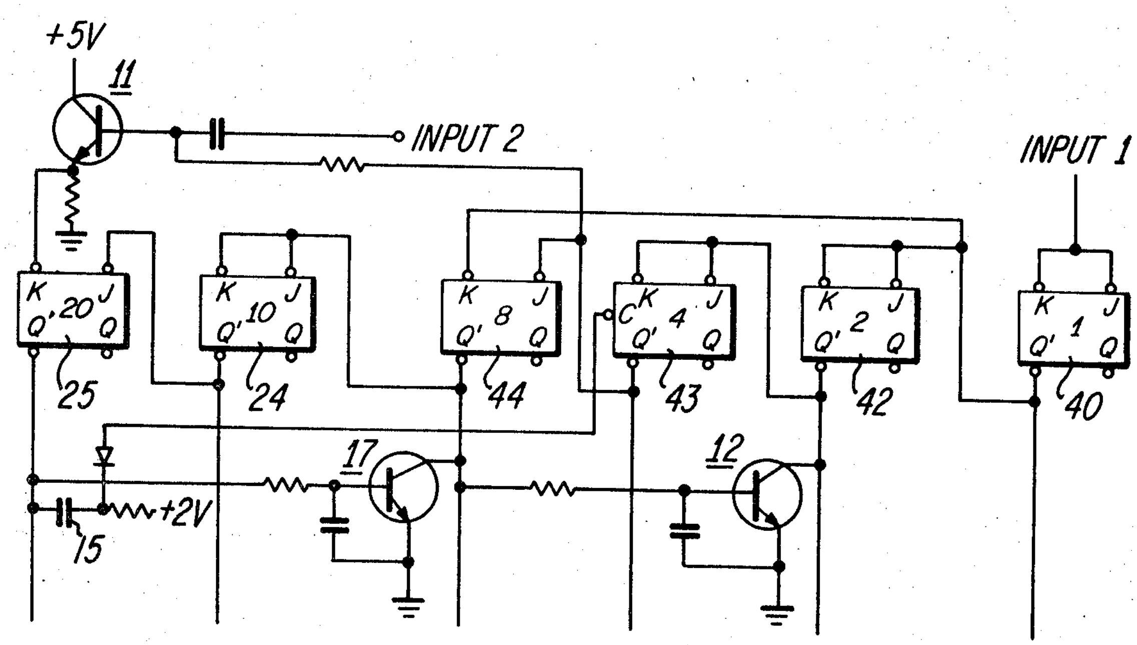
FIG. 5 is a detailed logic diagram of another embodiment of the invention as used in a 24-hour clock.

FIG. 3 is a block diagram symbol of the circuit of FIG. 2 and is used in FIGS. 4 and 5.

The counter portion of FIG. 1 is shown in FIG. 4 in more detail. The indicators have been omitted as they do not form part of the invention.

Assume for purposes of explanation that the 1's flip-flop 40 is set (Q′ is high) and that all other flip-flops are reset. The counter will be indicating, therefore, a count of 1.

The input pulses are coupled to both the J and K inputs of the 1's flip-flop 40 and through a capacitor 19 to a gating means comprising a transistor 14. A negative-going input pulse resets the 1's flip-flop 40.

The negative-going pulse at the Q′ output of the 1's flip-flop 40 is coupled to both the inputs of the 2's flip-flop 42 and to the K input of the 8's flip-flop 44. The result of resetting the 1's flip-flop 40 is to cause the 2's flip-flop 42 to be set and to reset the 8's flip-flop 44. However, the 8's flip-flop 44 is already reset so there is no change in the state of the 8's flip-flop.

The Q′ output of the 2's flip-flop 42 is coupled to both the inputs of the 4's flip-flop 43 and also through a resistor to the base of the gating transistor 14. When the 2's flip-flop is reset, the Q′ output goes low and cuts off the gating transistor 14. The K input of the 10's flip-flop 24 is therefore low. This has no effect on the 10's flip-flop 24, however, because the inputs are a-c coupled.

The setting of the 2's flip-flop 42 causes its Q′ output to go high, turning on the gating transistor 14 and causing the K input of the 10 flip-flop 24 to go high. This has no effect on the 10's flip-flop 24 because the negative-going edge of the pulses is required to change the state of the flip-flops.

The effect of the first pulse has been to change the count value to 2 and to raise the voltage on the K set input of the 10's flip-flop 24. The next input pulse causes the 1's flip-flop 40 to be set and the Q′ output to go high, which has no effect on the 2's flip-flop 42 or the 8's flip-flop 44. The same input pulse, however, is coupled via the capacitor 19 to the base of the gating transistor 14 so that the gating transistor 14 is cut off for a period depending on the RC constant at its base. While cut off, the emitter is low and tends to reset the 10's flip-flop 24 which was reset anyway. After the second pulse, the 2's flip-flop 42 and the 1's flip-flop 40 are both set and the other flip-flops are reset.

The next pulse resets the 1's flip-flop 40 which, in turn, resets the 2 flip-flop 42 which, in turn, sets the 4's flip-flop 43. Another input pulse is supplied to reset the 10 flip-flop 24 but has no effect on its state.

In a similar fashion, each successive pulse causes the 1's flip-flop 40 and the 2's flip-flop 42 to count up until at the end of the sixth pulse, the 4's flip-flop 43, the 2's flip-flop 42 and the 1's flip-flop 40 are all set indicating the decimal value of 7. At the next input pulse, the 1's flip-flop 40 is reset which causes the 2's flip-flop 42 to be reset which, in turn, causes the 4's flip-flop 43 to be reset.

Resetting of the 4's flip-flop 43 causes the Q′ output to go low and this output is coupled to the J input of the 8's flip-flop 44 causing the 8's flip-flop 44 to be set. When the 8's flip-flop 44 is set, the Q′ output goes high and being coupled to the base of the holding transistor 12, causes that transistor to conduct. The collector of the holding transistor 12 couples the Q′ output of the 2's flip-flop 42 to ground.

The next input pulse sets the 1's flip-flop 40 and its Q′ output goes high. However, the latter has no effect on the 8's flip-flop 44 so that the count becomes 1001 or decimal 9. The next input pulse resets the 1's flip-flop 40 and the low Q′ output causes the 8's flip-flop 44 to be reset and also triggers the 2's flip-flop 42 to the set state. The holding transistor 12, however, is clamping the Q′ output of the 2 flip-flop 42 to ground so that the negative pulse applied to the J and K inputs of flip-flop 42 has no effect. The holding transistor 12 conducts for a sufficient period of time after the 8's flip-flop 44 is reset by virtue of the charge on the capacitor 13 connected between the base of the transistor 12 and its emitter to insure proper operation.

Therefore, when the counter is storing a decimal value of 9 (1001), the next pulse resets the 8's flip-flop 44 and the 1's flip-flop 40, and the 2's flip-flop 42 is prevented from being set by the holding transistor 12. Thus, the BCD portion of the counter changes its count from 1001 to 0000 (decimal zero).

When the 8's flip-flop 44 becomes reset, its Q′ output goes low and sets the 10's flip-flop 24 (the Q′ output of the 10's flip-flop goes high). The counter, therefore, stores 10000 or decimal 10.

When the 10's flip-flop 24 is set, the Q′ output is high turning on the holding transistor 16. The holding transistor 16 serves to hold the 4's flip-flop 43 in the reset state. Setting the 10's flip-flop 24 also applies a positive-going pulse to the capacitor 15 but the diode present in the connection from the diode to the C terminal of the 2's flip-flop is poled in a direction to prevent this pulse from passing to or affecting the state (reset) of the 2's flip-flop.

The following input pulse sets the 1's flip-flop 40 and the next input pulse resets the 1's flip-flop 40 and sets the 2's flip-flop 42. At this point the counter is indicating a decimal value of 12 (10010).

The setting of the 2 flip-flop 42 turns on the gating transistor 14 bringing the K input of the 10 flip-flop 24 to a high level. This has no effect on the state of the 10's flip-flop 24.

The next pulse sets the 1's flip-flop 40 and also causes a reset pulse to be applied to the K input of the 10's flip-flop 24, as previously described, resetting the 10's flip-flop.

Resetting the 10's flip-flop 24 causes its Q' output to go low and this low is coupled via the capacitor 15 to the C input of the 2's flip-flop 42 causing it to be reset. Resetting the 2's flip-flop 42 tends to set the 4's flip-flop 43 but the latter is maintained in its reset condition (Q' low) by the action of the holding transistor 16. As already mentioned, the latter continues to conduct for a short period of time after the 10's flip-flop 24 has been reset, clamping the Q' terminal of flip-flop 43 to ground for a period of sufficient for the negative pulse applied to its J and K terminals to dissipate.

Therefore, from a count value of 12 the counter changes directly to a count value of 1. The above-described action continues in cyclical fashion in response to the successive input pulses.

A 24-hour arrangement using the present invention is illustrated in FIG. 5. One pulse per hour is provided on input 1 to change the state of the 1's flip-flop 40. The 2's flip-flop 42, the 4's flip-flop 43, and the 8's flip-flop 44 are coupled as before to provide a BCD count from 0 to 9. The output of the 8's flip-flop 44 is coupled to change the state of 10's flip-flop 24 whenever the 8's flip-flop 44 is reset. A negative-going pulse at the Q' output of the 10's flip-flop 24 is applied to the J terminal of the 20's flip-flop 25 for setting the latter in response to the resetting of the 10's flip-flop 24.

A second input (input 2) is provided in this circuit for resetting the 20's flip-flop 25 whenever the 4's flip-flop 43 is set. The second input is provided at the rate of one per second in this embodiment. The result of such an arrangement is that a count of 24 is displayed for one second and then the counter is reset to zero.

The Q' output of the 20's flip-flop 25 is coupled to reset the 4's flip-flop 43 each time the 20's flip-flop 25 is reset. A gating transistor 11 is provided to couple a reset pulse from input 2 to the 20's flip-flop 25 whenever the 4's flip-flop 43 is set.

A holding transistor 17 is coupled to hold the 8's flip-flop 44 reset while the 20's flip-flop is set and for a short period of time thereafter. This prevents the 8's flip-flop 44 from being set at the time the 4's flip-flop 43 is reset 1 second after the count of 24 has been reached.

A holding transistor 12 is provided for holding the 2's flip-flop 42 reset while the 8's flip-flop 44 is set and for a short period of time after being reset. This holding transistor performs the same function as in FIG. 4. It prevents the 2's flip-flop 42 from being set during the transition from the count of 9 to 0.

Starting from a count of 0, successive hour input pulses are counted up to a value of 9. At that point, the 8's flip-flop 44 and the 1's flip-flop 40 are set. At the next pulse, the 8's flip-flop 44 and the 1's flip-flop 40 become reset and the 2's flip-flop 42 is held reset by means of the holding transistor 12.

The resetting of the 8's flip-flop 44 causes the 10's flip-flop 24 to be triggered to a set condition (its Q' output goes high). The unit flip-flops 44, 43, 42 and 40 will count from 0 to 9 as before and at the transition from 9 to 0, the 10's flip-flop 24 will be triggered to the reset state which, in turn, will cause the 20's flip-flop 25 to be triggered to the set state.

An input pulse occuring in the next second is coupled to the base of the gating transistor 11 to reset the 20's flip-flop 25. This couples a negative pulse through the capacitor 15 to the 4's flip-flop 43 causing it to be reset.

The holding transistor 17 holds the 8's flip-flop 44 reset thereby inhibiting the set action caused by the resetting of the 4's flip-flop 43.

What is claimed is:

1. In a circuit for counting electrical pulses comprising four flip-flops representing, when set, the count values of 1, 2, 4 and 8 coupled to provide a BCD count from zero to 9, and a fifth flip-flop for representing, when set, a count value of 10, said fifth flip-flop coupled to the value-of-8 flip-flop, whereby said fifth flip-flop is set when said value-of-8 flip-flop is reset, the improvement comprising:

first holding means for keeping the value-of-2 flip-flop reset during the time the value-of-8 flip-flop is set and for an additional period of time sufficient to prevent it from being set during an input pulse period and less than the time between input pulses, after said value-of-8 flip-flop is reset;

second holding means for keeping the value-of-4 flip-flop reset during the time the value-of-10 flip-flop is set and for an additional period of time sufficient to prevent it from being set during an input pulse period and less than the time between input pulses, after said value-of-10 flip-flop is reset;

gating means responsive to the input pulse and the value-of-2 flip-flop for resetting the value-of-10 flip-flop with every input pulse that occurs during the time the value-of-2 flip-flop is set; and means for resetting the value-of-2 flip-flop when the value-of-10 flip-flop is reset.

2. The invention as claimed in claim 1 wherein said first and second holding means each comprise a transistor having a collector coupled to the reset output of the value-of-2 flip-flop and the value-of-4 flip-flop, respectively, an emitter coupled to a reference reset level, and a base coupled through a resistor to the reset output of the value-of-8 flip-flop and the reset output of the value-of-10 flip-flop, respectively, and each base coupled to its emitter through a capacitor.

3. The invention as claimed in claim 2, wherein said gating means comprises a transistor connected in the emitter follower configuration with the emitter coupled to the reset input of the value-of-10 flip-flop and the base coupled to the electrical pulses through a capacitor and to the reset output of the value-of-2 flip-flop through a resistor.

4. The invention as claimed in claim 3, including means for coupling the outputs of the flip-flop to a read-out indicator.

5. In a circuit for counting electrical pulses comprising four flip-flops representing when set the count values of 1, 2, 4, and 8 coupled to provide a BCD count from zero to 9, a fifth flip-flop representing, when set, a count value of 10, and a sixth flip-flop for representing, when set, a count value of 20, said fifth flip-flop coupled to the value-of-8 flip-flop, whereby the fifth flip-flop is caused to change state when said value-of-8 flip-flop is reset and the sixth flip-flop is coupled to the fifth flip-flop, whereby said sixth flip-flop will be set when the fifth flip-flop is reset, the improvement comprising:

a first holding means for keeping the value-of-2 flip-flop reset during the time the vlaue-of-8 flip-flop is set and for an additional period of time thereafter sufficient to prevent it from being set during the next input pulse period but less than the time between input pulses;

second holding means for keeping the value-of-8 flip-flop reset during the time the sixth flip-flop is set and for an additional period of time thereafter sufficient to prevent it from being set during the next input pulse period but less than the time between input pulses;

a second source of electrical pulses occurring at a faster rate than the pulses being counted;

gating means responsive to the pulses from said second source of input pulses and the value-of-4 flip-flop for resetting the sixth flip-flop with every input pulse from said second source that occurs during the time the value-of-4 flip-flop is set; and means for resetting the value-of-4 flip-flop when the sixth flip-flop is reset.

6. The invention as claimed in claim 5 wherein said first and second holding means each comprise a transistor having a collector coupled to the reset output of the value-of-2 flip-flop and the value-of-4 flip-flop, respectively, an emitter coupled to a reference reset level, and a base coupled through a resistor to the reset output of the value-of-8 flip-flop and the reset output of the sixth flip-flop, respectively, and each base coupled to its emitter through a capacitor.

7. The invention as claimed in claim 6 wherein said gating means comprises a transistor connected in the emitter follower configuration with the emitter coupled to the reset input of the sixth flip-flop, and the base coupled to the second source of electrical pulses through a capacitor and to the reset output of the value-of-4 flip-flop through a resistor.

8. The invention as claimed in claim 7 including means for coupling the output of the flip-flops to read-out indicators.

* * * * *